(12) United States Patent
 Lee et al.

(10) Patent No.: US 9,099,360 B2
(45) Date of Patent: Aug. 4, 2015

(54) DISPLAY DEVICE AND MANUFACTURING METHOD THEREOF

(71) Applicant: Samsung Display Co., Ltd., Yongin, Gyeonggi-Do (KR)

(72) Inventors: Je Hun Lee, Seoul (KR); Min Kyu Kim, Suwon-si (KR); Yeon Hong Kim, Hwaseong-si (KR); Yeon Gon Mo, Yongin-si (KR); Ki Ju Im, Suwon-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/334,525

(22) Filed: Jul. 17, 2014

(65) Prior Publication Data

US 2015/0115257 A1  Apr. 30, 2015

(30) Foreign Application Priority Data

Oct. 29, 2013  (KR) .......................... 10-2013-0129354

(51) Int. Cl.
 *H01L 27/13* (2006.01)
 *H01L 27/12* (2006.01)
 *H01L 29/78* (2006.01)

(52) U.S. Cl.
 CPC .......... *H01L 27/1251* (2013.01); *H01L 27/127* (2013.01); *H01L 29/7831* (2013.01)

(58) Field of Classification Search
 CPC ...................... H01L 27/1251; H01L 29/7831
 USPC ............................................ 257/59, 365, 366
 See application file for complete search history.

(56) References Cited

U.S. PATENT DOCUMENTS

| | | | |
|---|---|---|---|
| 7,645,650 B2 | 1/2010 | Bryant et al. | |
| 2004/0065882 A1* | 4/2004 | Yamazaki et al. | 257/59 |
| 2009/0278186 A1 | 11/2009 | Sonsky et al. | |
| 2009/0302325 A1* | 12/2009 | Huh et al. | 257/72 |
| 2011/0079784 A1* | 4/2011 | Im | 257/59 |
| 2011/0169010 A1* | 7/2011 | Park et al. | 257/72 |
| 2013/0075811 A1 | 3/2013 | Wang et al. | |
| 2014/0061653 A1* | 3/2014 | Kim et al. | 257/59 |
| 2014/0353659 A1* | 12/2014 | Park | 257/43 |

FOREIGN PATENT DOCUMENTS

| | | |
|---|---|---|
| JP | 2776083 B2 | 5/1998 |
| KR | 10-0801961 B1 | 1/2008 |

OTHER PUBLICATIONS

Lee, et al., "Extraction of Subgap Density of States in Amorphous InGaZnO Thin-Film Transistors by Using Multifrequency Capacitance—Voltage Characteristics," *IEEE Electron Device Letters*, vol. 31, No. 3, Mar. 2010, pp. 231-233.

\* cited by examiner

*Primary Examiner* — Allan R Wilson
(74) *Attorney, Agent, or Firm* — Knobbe Martens Olson & Bear LLP (57) ABSTRACT

A display device and a manufacturing method thereof with improved performance and low manufacturing complexity are provided. One inventive aspect includes: a first control electrode, a semiconductor layer, an etch stop layer, a first input electrode and a first output electrode, a third control electrode, a passivation layer and a pixel electrode. The third control electrode is formed on the etch stop layer. The passivation layer is formed on the first electrode, the first output electrode and the third control electrode. The pixel electrode is formed on the passivation layer and connects to the first output electrode.

21 Claims, 10 Drawing Sheets

DISPLAY DEVICE AND MANUFACTURING METHOD THEREOF

CROSS-REFERENCE TO RELATED APPLICATIONS

This application claims priority to and the benefit of Korean Patent Application No. 10-2013-0129354 filed in the Korean Intellectual Property Office on Oct. 29, 2013, the entire contents of which are incorporated herein by reference.

BACKGROUND

1. Field

The disclosed technology relates to a display device and a manufacturing method thereof with improved performance and low manufacturing complexity.

2. Description of the Related Technology

A thin film transistor (TFT) for a flat panel display device, such as a liquid crystal display element, an electroluminescence display element or an inorganic electroluminescent element, is used as a switching element to control the operation of each pixel and a driving element to drive pixels.

In general, a TFT includes source and drain regions that are highly doped with impurities, an active layer, a gate electrode, and source and drain electrodes. The gate electrode is positioned at a position corresponding to the channel region and the source and drain electrodes respectively contact the source and drain regions.

The active layer is formed of a semiconductor material, such as amorphous silicon or polysilicon, and has a channel region, which is formed between the source and drain regions.

When the active layer is formed of amorphous silicon, it usually is difficult to embody a high speed driving circuit because carrier mobility, the mobility of electrons and holes, is low. When the active layer is formed of polysilicon, an additional compensation circuit is needed because the carrier mobility can be high and a threshold voltage Vth is not uniform. Recently, research for using an oxide semiconductor as an active layer have been conducted in order to solve the problem described above.

An oxide TFT using the oxide semiconductor as the active layer is easily implemented and can have a large area when manufactured in a low temperature process. In addition, an oxide TFT has a very favorable electrical property like polysilicon.

The above information disclosed in this Background section is only for understanding of the invention. It may contain information that does not constitute prior art.

SUMMARY OF CERTAIN INVENTIVE ASPECTS

The disclosed technology has been made in an effort to provide a display device and a manufacturing method thereof having enhanced performance and a simple manufacturing process through a double gate electrode simultaneously formed with source and drain electrodes.

A display device according to one aspect of the disclosed technology includes: a first control electrode positioned on a substrate, a semiconductor positioned on the first control electrode, an etch stopper positioned on the semiconductor, a first input electrode and a first output electrode positioned on the semiconductor while not overlapping the etch stopper, a third control electrode positioned on the etch stopper, a passivation layer positioned on the first input electrode, the first output electrode, and the third control electrode, and a pixel electrode positioned on the passivation layer and connected to the first output electrode.

The first input electrode, the first output electrode, and the third control electrode can be made of the same material.

The third control electrode can be less wide than the etch stopper.

A distance between one end of the third control electrode and one end of the etch stopper can be about 0.1 to 2 μm.

The semiconductor can include an oxide semiconductor.

The semiconductor positioned between the first input electrode and the etch stopper and between the first output electrode and the etch stopper can be doped with an n+ dopant.

The first and third control electrodes can be applied with the same voltage.

An etch stopper can be further configured to overlap the first input electrode and the first output electrode.

A manufacturing method of a display device according to another aspect of the disclosed technology includes: forming a gate conductor including a first control electrode on a substrate, forming a gate insulating layer on the gate conductor, forming a etch stopper on the semiconductor, forming a first input electrode, a first output electrode, and a third control electrode on the etch stopper and the semiconductor, forming a passivation layer on the first input electrode, the first output electrode, and the third control electrode, and forming a pixel electrode connected to the first output electrode on the passivation layer.

The first input electrode, the first output electrode, and the third control electrode are made of the same material and can be simultaneously formed.

The third control electrode can have a smaller width than the etch stopper.

The distance between one end of the third control electrode and one end of the etch stopper can be formed to be about 0.1 to 2 μm.

The semiconductor is formed to include an oxide semiconductor, and n+ doping of the semiconductor positioned between the first input electrode and the etch stopper and between the first output electrode and the etch stopper can be further included.

The n+ doping of the semiconductor can be performed after forming the etch stopper.

The n+ doping of the semiconductor can be performed after forming the first input electrode, the first output electrode, and the third control electrode.

The passivation layer is made of a material containing silicon, and the semiconductor contacting the passivation layer can form an n+ doped region as the passivation layer is heat-treated.

The first and third control electrodes can be applied with the same voltage.

Forming an etch stopper overlapping the first input electrode and the first output electrode can be further included.

According to the display device and the manufacturing method thereof described above, a display device with superior performance can be provided by embodying a double gate structure with a simple manufacturing process.

DETAILED DESCRIPTION OF CERTAIN INVENTIVE EMBODIMENTS

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

In the following description, technical terms are used only to explain a specific exemplary embodiment while not limiting the disclosed technology. The terms of a singular form may include plural forms unless referred to the contrary. The terms "include," "comprise," "including," and "comprising," as used herein, specify a component, a process, an operation, and/or an element but do not exclude other components, processes, operations, and/or elements. It will be understood that although the terms "first" and "second" are used herein to describe various elements, these elements should not be limited by these terms. These terms are only used to distinguish one component from other components.

It will be understood that when a layer, region, or component is referred to as being "formed on," another layer, region, or component, it can be directly or indirectly formed on the other layer, region, or component. That is, for example, intervening layers, regions, or components may be present.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it is directly on the other element or intervening elements may also be present.

Throughout this specification and the claims that follow, when it is described that an element is "connected" to another element, the element is "directly connected" to the other element or "electrically connected" to the other element through a third element. In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Here, when a first element is described as being connected to a second element, the first element is not only directly connected to the second element but may also be indirectly connected to the second element via a third element. Further, some of the elements that are not essential to the complete understanding of the disclosed technology are omitted for clarity. Also, like reference numerals refer to like elements throughout.

A display device 101 including a thin film transistor 10 according to an exemplary embodiment of the disclosed technology will be described hereinafter with reference to FIGS. 1 to 5.

Figure 1:
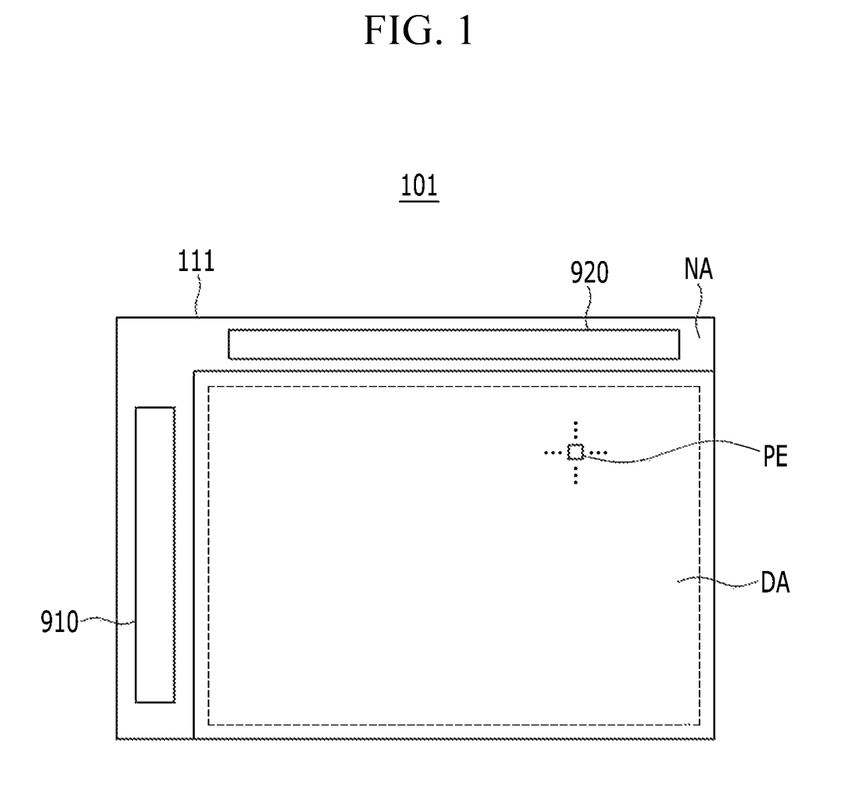
FIG. 1 is a top plan view schematically illustrating a structure of a display device according to an exemplary embodiment of the disclosed technology.
Figure 2:
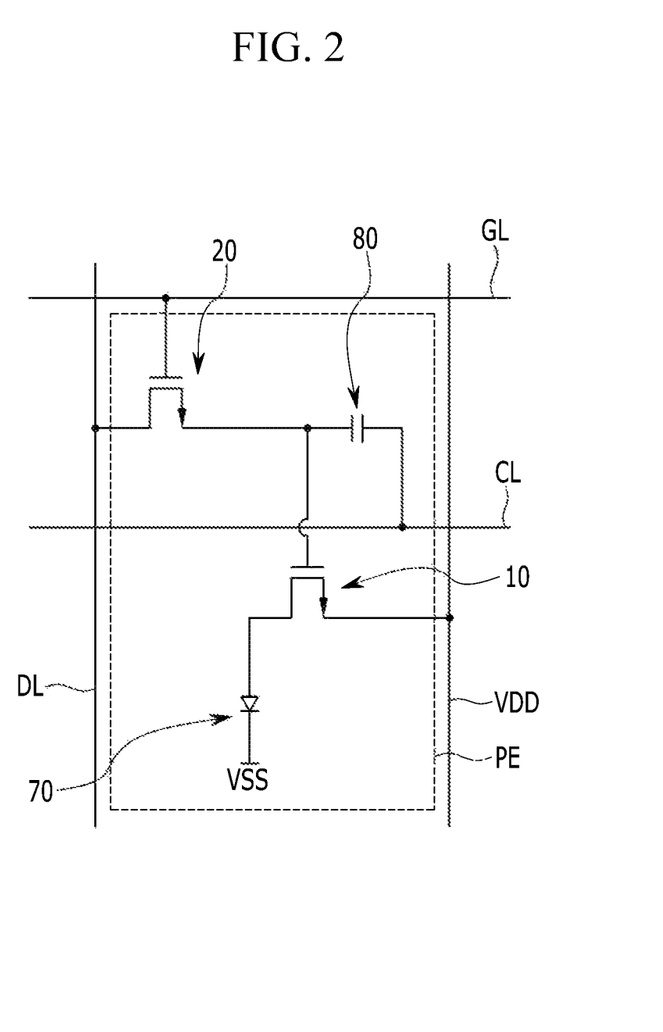
FIG. 2 is a circuit diagram illustrating a pixel circuit of the display device of FIG. 1.
Figure 3:
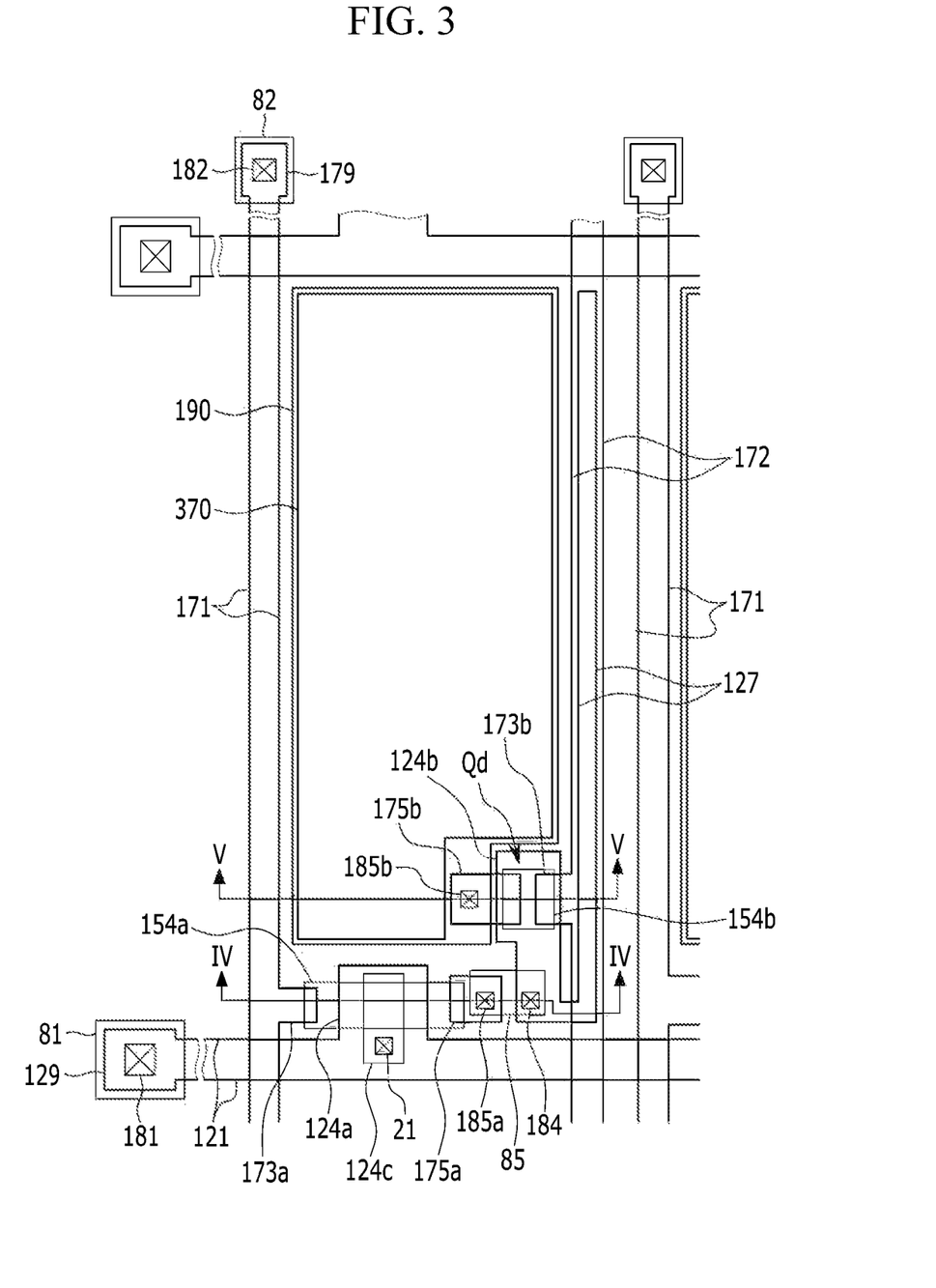
FIG. 3 is a layout view illustrating one pixel of the display device of FIG. 1.
Figure 4:
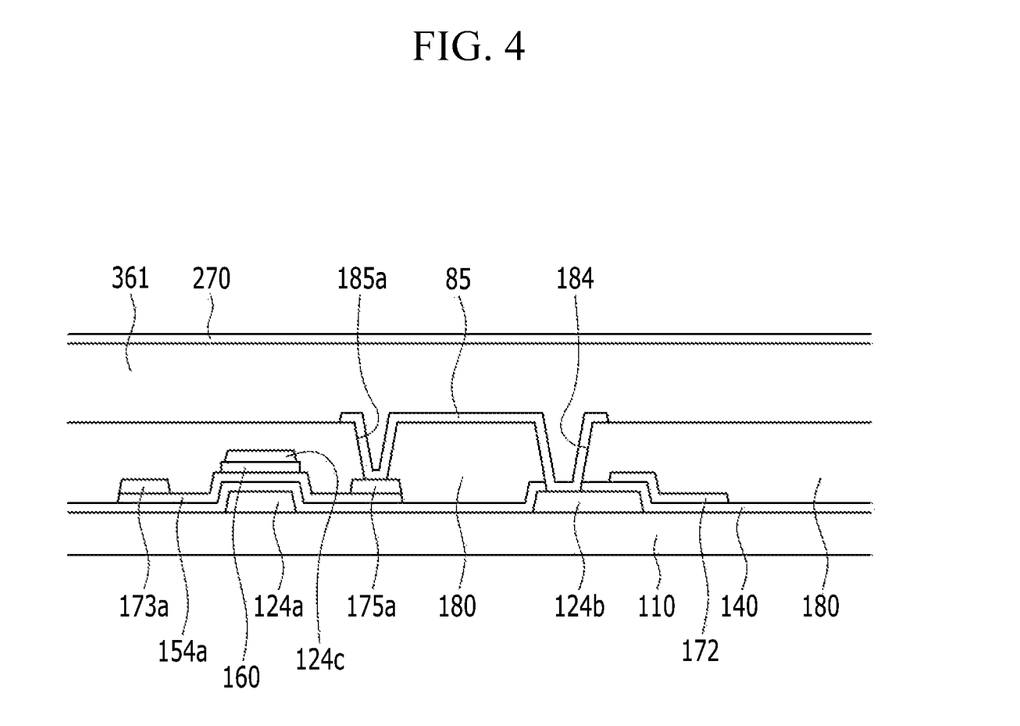
FIG. 4 is a cross-sectional view of FIG. 3 taken along the line IV-IV.
Figure 5:
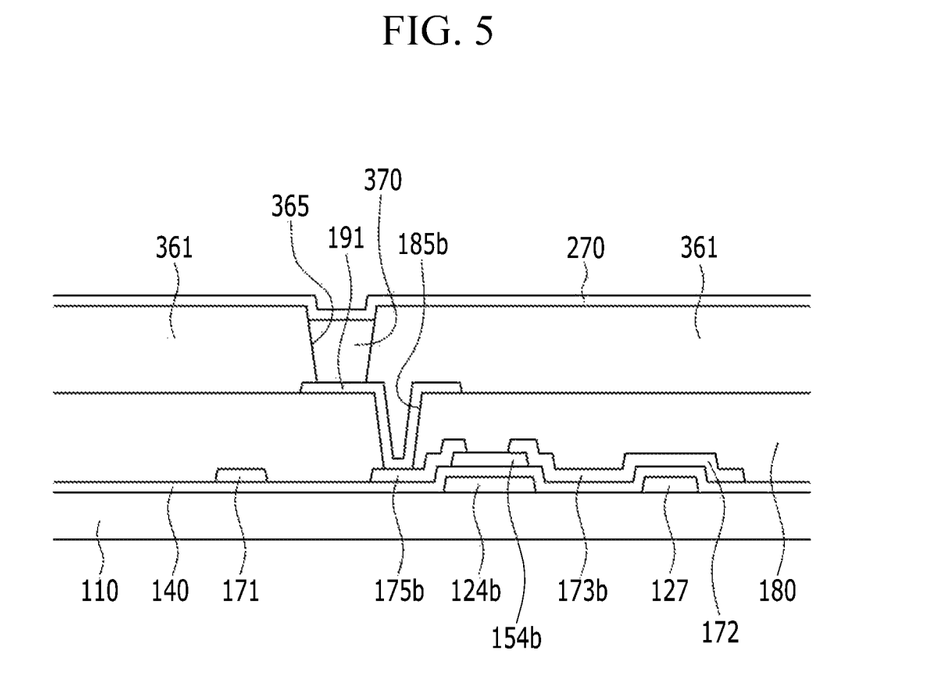
FIG. 5 is a cross-sectional view of FIG. 3 taken along the line V-V.

FIG. 1 is a top plan view schematically illustrating a structure of a display device according to an exemplary embodiment of the disclosed technology, FIG. 2 is a circuit diagram illustrating a pixel circuit of the display device of FIG. 1, FIG. 3 is a layout view illustrating one pixel of the display device of FIG. 1, FIG. 4 is a cross-sectional view of FIG. 3 taken along the line IV-IV, and FIG. 5 is a cross-sectional view of FIG. 3 taken along the line V-V.

As shown in FIG. 1, the display device 101 includes a substrate body 111 partitioned into a display area DA and a non-display area NA.

The display area DA of the substrate body is formed with a plurality of pixel areas PE to display an image, while the non-display area NA is formed with one or more driving circuits 910 and 920.

Herein, the pixel area PE refers to an area in which a pixel (i.e., a minimum unit to display an image) is formed.

However, in some exemplary embodiments of the disclosed technology, both driving circuits 910 and 920 do not necessarily need to be formed in the non-display area NA. The driving circuits 910 and 920 may be omitted in whole or in part.

As shown in FIG. 2, the display device 101 according to one exemplary embodiment of the disclosed technology is an organic light emitting diode (OLED) display having a 2Tr-1Cap structure. In the 2Tr-1Cap structure, an organic light emitting diode 70, two thin film transistors (TFT) 10 and 20, and one capacitor 80 are formed in each pixel area PE.

However, the exemplary embodiment of the disclosed technology is not limited thereto.

Accordingly, the display device 101 may be an organic light emitting diode (OLED) display having a structure in which three or more thin film transistors or two or more capacitors are formed in each pixel area PE.

Further, the display device 101 may be formed with additional wires to have a variety of structures.

As described above, one or more among thin film transistors and capacitors additionally formed may be constituent elements of a compensation circuit.

The compensation circuit serves to suppress a deviation in display quality by improving uniformity of the organic light emitting diode 70 formed in each pixel area PE.

In general, the compensation circuit may include two to eight thin film transistors.

Further, the driving circuits 910 and 920 (shown in FIG. 1) formed on the non-display area NA of the substrate body 111 may also include additional thin film transistors.

The organic light emitting diode 70 includes an anode (i.e., a hole injection electrode), a cathode (i.e., an electron injection electrode), and an organic emission layer. The organic emission layer is formed between the anode and the cathode.

In detail, in one exemplary embodiment of the disclosed technology, the display device 101 includes the first thin film transistor 10 and the second thin film transistor 20 in each pixel area PE.

Each of the first and second thin film transistors 10 and 20 includes a gate electrode, a semiconductor, a source electrode (i.e., an input electrode), and a drain electrode (i.e., an output electrode).

Although FIG. 2 illustrates a capacitor line CL together with a gate line GL, a data line DL, and a common power source line VDD, the exemplary embodiment of the disclosed technology is not limited to the structure illustrated in FIG. 2.

Accordingly, the capacitor line CL may be omitted depending on the cases.

The source electrode of the second thin film transistor 20 is connected to the data line DL. The gate electrode of the second thin film transistor 20 is connected to the gate line GL.

The drain electrode of the second thin film transistor 20 is connected to the capacitor line CL through the capacitor 80.

A node is formed between the drain electrode of the second thin film transistor 20 and the capacitor 80. The gate electrode of the first thin film transistor 10 is connected to the node.

The common power source line VDD is connected to the drain electrode of the first thin film transistor 10. The anode of the organic light emitting diode 70 is connected to the source electrode of the first thin film transistor 10.

The second thin film transistor 20 is used as a switching element for selecting a pixel area PE which will be light-emitted.

When the second thin film transistor 20 is abruptly turned on, the capacitor 80 is charged. In this instance, the amount of charge is proportional to the potential of a voltage supplied through the data line DL.

When a signal indicating a voltage increase in a cycle of one frame is inputted to the capacitor line CL while the first thin film transistor 20 is turned off, the gate potential of the first thin film transistor 10 rises in accordance with the level of a voltage applied through the capacitor line CL on the basis of the potential charged in the capacitor 80.

The first thin film transistor 10 is turned on when the gate potential exceeds a threshold voltage.

The voltage applied to the common power source line VDD is then applied to the organic light emitting diode 70 through the first thin film transistor 10 such that the organic light emitting diode 70 is light-emitted.

The construction of the pixel area PE is not limited to the exemplary embodiment described above, but can be modified in various ways within the scope which can be easily modified by those skilled in the art.

Further, the display device 101 according to the exemplary embodiment of the disclosed technology is a liquid crystal display device, though this is not illustrated.

In this instance, the display device 101 includes a liquid crystal layer and may be formed to have various structures known to a person of ordinary skill in the art.

Now, the display device illustrated in FIGS. 1 to 2 will be described in detail with reference to FIGS. 3 to 5.

A plurality of gate lines 121 including a first control electrode 124a and a plurality of gate conductors including a plurality of second control electrodes 124b are positioned on an insulating substrate 110. The insulating substrate 110 is formed of transparent glass or plastic.

The gate lines 121 transmit gate signals, and mainly extend in a horizontal direction.

Each gate line 121 includes a wide end portion 129 for connection with another layer or an external driving circuit, and the first control electrode 124a extends upwards from the gate line 121.

In case a gate driving circuit (not illustrated) generating a gate signal is integrated on the substrate 110, the gate line 121 is extended to be directly connected to the gate driving circuit.

The second control electrode 124b includes a storage electrode 127 which is separated from the gate line 121, extended down, turned to the right, and then elongated upwards.

The gate conductors 121 and 124b may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like.

However, the gate conductors 121 and 124b may have a multi-layered structure including two conductive layers (not illustrated) having different physical properties.

One conductive layer thereof is made of a metal having low resistivity, such as, an aluminum-based metal, a silver-based metal, a copper-based metal, and the like, so as to reduce signal delay or voltage drop.

Other conductive layers may be formed using a material having good physical, chemical, and electrical contact characteristics particularly with indium tin oxide (ITO) and indium zinc oxide (IZO), such as a molybdenum-based metal, chromium, tantalum, titanium, and the like.

Preferred exemplary implementations of the combination includes a chromium lower layer and an aluminum (alloy) upper layer, and an aluminum (alloy) lower layer and a molybdenum (alloy) upper layer.

However, the gate conductors 121 and 124b may be made of various metals or conductors in addition to those described above.

Lateral sides of the gate conductors 121 and 124b are inclined to the surface of the substrate 110, and inclination angles thereof is preferably about 30 to 80 degrees.

A gate insulating layer 140 made of a silicon nitride ($SiN_x$) or a silicon oxide ($SiO_x$) is formed on the gate conductors 121 and 124b.

A semiconductor 154a made of hydrogenated amorphous silicon (referred to as a-Si) and the like is formed on the gate insulating layer 140 to overlap the control electrode 124 while being formed in parallel with the gate line 121.

An etch stopper 160 is positioned on a protruded upper part of the semiconductor 154a.

The semiconductor 154a is partially doped with an n+ dopant such that the etch stopper 160 protects a remaining part other than the doped part.

The etch stopper 160 has a similar shape as the third control electrode 124c to be described later when viewed on a plane.

The etch stopper 160 has the similar shape as the third control electrode 124c on the plane in the present specification. The source and drain electrodes may be further positioned on the region overlapping the semiconductor other than the etch stopper 160.

The etch stopper 160 is positioned on the region where the source and the drain electrodes overlap the semiconductor and facilitates a connection between the first and third control electrodes 124a and 124c.

A plurality of stripe-shaped and island-shaped ohmic contacts (not shown) made of silicide or a material such as n+ hydrogenated amorphous silicon highly doped with an n-type impurity may be formed on the upper part of the semiconductor, but are omitted in the present specification.

Lateral sides of the semiconductor 154a are also inclined, and inclination angles thereof are 30 to 80 degrees.

A plurality of data conductors including a plurality of data lines 171, a plurality of driving voltage lines 172, and a plurality of first and second output electrodes 175a and 175b are positioned on the semiconductor 154a and the etch stopper 160.

The data line 171 transmits a data signal and mainly extends in a vertical direction to cross the gate line 121.

Each data line 171 includes the first input electrodes 173a and a wide end portion 179 for connection with another layer or an external driving circuit. The first input electrodes 173a extend towards the first control electrode 124a, When a data driving circuit (not shown) generating a data signal may be integrated on the substrate 110, the data line 171 may be extended to be directly connected to the data driving circuit.

The driving voltage line 172 transmits a driving voltage and mainly extends in a vertical direction to cross the gate line 121.

Each driving voltage line 172 includes a plurality of second input electrodes 173b extending towards the second control electrode 124b.

The driving voltage line 172 overlaps the storage electrode 127. The driving voltage line 172 may be connected to each other.

The first and second output electrodes 175a and 175b are separated from each other. The first and second output electrodes 175a and 175b are also separated from the data line 171 and the driving voltage line 172.

The first input electrode 173a and the first output electrode 175a face each other based on the first control electrode 124a and the etch stopper 160. The second input electrode 173b and the second output electrode 175b face each other based on the second control electrodes 124b.

The third control electrode 124c is positioned on the etch stopper 160 which is the same layer as the data conductive layer.

The third control electrode 124c may have a similar planar shape as the etch stopper 160 on the plane.

Particularly, the third control electrode 124c has a width that is less than the etch stopper 160.

In one exemplary implementation, a distance d between one end of the first control electrode 124c and one end of the etch stopper 160 is about 0.1 to 2 μm.

The third control electrode 124c has a similar shape as the planar shape of the first control electrode 124a, as shown in FIG. 3, but has a smaller width than that of the first control electrode 124a.

The third control electrode 124c does not overlap the first input electrode 173a and the first output electrode 175a when they are simultaneously formed. The third control electrode 124c does not overlap the first control electrode 124a when it is smaller than the etch stopper 160.

Accordingly, the third control electrode 124c does not form an additional storage capacitor Cst.

The first and third control electrodes are connected with each other through an opening 21. The first and third control electrodes can be supplied with the same voltage.

However, they are not limited thereto, and the first and third control electrodes may be respectively applied with an independent voltage source.

The data conductors 171, 172, 175a, and 175b are preferably made of refractory metals such as molybdenum, chromium, tantalum, titanium, or alloys thereof. The data conductors 171, 172, 175a, and 175b may have a multi-layered structure including a refractory metal layer (not shown) and a low resistance conductive layer (not shown).

Meanwhile, the third control electrode 124c integrally formed with the data conductors may equally be made of the same material described above.

One exemplary implementation of the multi-layered structure may include a double layer and a triple layer. The double layer has a chromium or molybdenum (alloy) lower layer and an aluminum (alloy) upper layer. The triple layer has a molybdenum (alloy) lower layer, an aluminum (alloy) intermediate layer and a molybdenum (alloy) upper layer.

However, the data conductors 171, 172, 175a, and 175b and the third control electrode 124c may be made of various metals or conductors other than those described above.

It is preferable that lateral sides of the data conductors 171, 172, 175a, and 175b and the third control electrode 124c are also preferably inclined to the surface of the substrate 110 with inclination angles of about 30 to 80 degrees, like the gate conductors 121 and 124b.

The ohmic contacts (not shown) exist only between the semiconductors 154a and 154b formed therebelow and the data conductors 171, 172, 175a, and 175b formed thereabove to lower contact resistance therebetween.

The semiconductors 154a are provided with an exposed portion, which is not covered with the data conductors 171, 172, 175a, and 175b, between the input electrode 173a and the third control electrode 124c and between the output electrode 175a and the third control electrode 124c.

Regions between the input electrode 173a and the third control electrode 124c and between the output electrode 175a and the third control electrode 124c may be doped with an n+ dopant, but the doped regions are not limited thereto. A part of the semiconductor overlapping the output electrode 175a or the input electrode 173a may also be doped with the n+ dopant.

A passivation layer 180 is formed on the data conductors 171, 172, 175a, and 175b and the exposed portions of the semiconductors 154a and 154b.

The passivation layer 180 is made of an inorganic insulator such as silicon nitride or silicon oxide, an organic insulator, a low-dielectric insulator, and the like.

It is preferable that the dielectric constants of the organic and low-dielectric insulators are less than 4.0, and one exemplary implementation of the low-dielectric insulator is an oxide containing fluorine such as a-SiOF, which is formed through plasma enhanced chemical vapor deposition (PECVD).

The passivation layer 180 may be made of an organic insulator having photosensitivity. The passivation layer 180 may have a flat surface.

Alternatively, the passivation layer 180 may have a double-layered structure having a lower inorganic layer and an upper organic layer so as to have excellent insulating characteristics of an organic layer while protecting the exposed portions of the semiconductors 154a and 154b.

The passivation layer 180 is formed with a plurality of contact holes 182, 185a, and 185b respectively exposing the end portion 179 of the data line 171, the first output electrode 175a, and the second output electrode 175b. The passivation layer 180 and the gate insulating layer 140 are formed with a plurality of contact holes 181 and 184 respectively exposing the end portion 129 of the gate line 121 and the second control electrode 124b.

A plurality of pixel electrodes 191, a plurality of connecting members 85, and a plurality of contact assistants 81 and 82 are formed on the passivation layer 180.

They may be made of a transparent conductive material such as ITO (indium tin oxide) or IZO (indium zinc oxide), or a reflective metal such as aluminum, sliver, or alloys thereof.

The pixel electrode 191 is physically and electrically connected to the second output electrode 175b through the contact hole 185b. The connecting member 85 is connected to the second control electrode 124b and the first output electrode 175a through the contact holes 184 and 185a.

The contact assistants 81 and 82 are respectively connected to the end portion 129 of the gate line 121 and the end portion 179 of the data line 171 through the contact holes 181 and 182.

The contact assistants 81 and 82 complement adhesive properties of the end portion 129 of the gate line 121 and the end portion 179 of the data line 171 with an external device, and protect them.

A partition wall 361 is formed on the passivation layer 180.

The partition wall 361 made of an organic insulator or an inorganic insulator defines an opening 365 by enclosing peripheral edges of the pixel electrode 191 like a bank.

The partition 361 may also be made of a photoresist including a black pigment. The partition 361 functions as a light blocking member in this instance such that a forming process may be simplified.

An organic light emitting member 370 is formed in the opening 365 positioned on the pixel electrode 191 defined by the partition 361.

The organic light emitting member 370 is made of an organic material which uniquely expresses any one of the primary colors such as three primary colors of red, green, and blue.

The organic light emitting diode (OLED) display displays a desired image by spatial combination of the primary colored light expressed by the organic light emitting members 370.

The organic light emitting member 370 may have a multilayered structure including auxiliary layers (not illustrated) to improve light emission efficiency of an emitting layer in addition to the emitting layer (not illustrated) emitting light.

An electron transport layer (not illustrated) and a hole transport layer (not illustrated) for adjusting a balance of electrons and holes, and an electron injecting layer (not illustrated) and a hole injecting layer (not illustrated) for reinforcing injection of the electrons and the holes, are included in the auxiliary layers.

A common electrode 270 is formed on the organic light emitting member 370.

The common electrode 270 receives a common voltage Vss. The common electrode 270 may be made of a reflective metal including calcium (Ca), barium (Ba), magnesium (Mg), aluminum, or silver, or a transparent conductive material such as ITO or IZO.

In the organic light emitting diode display, the first and third control electrodes 124a and 124c, the first input electrode 173a and the first output electrode 175a form a switching TFT Qs together with the first semiconductor 154a. The first and third control electrodes 124a and 124c connect to the gate line 121. The first input electrode 173a and the first output electrode 175a connect to the data line 171. A channel of the switching TFT Qs is formed in the first semiconductor 154a positioned between the first input electrode 173a and the first output electrode 175a.

The second control electrode 124b, the second input electrode 173b, and the second output electrode 175b form a driving TFT Qd together with the second semiconductor 154b. The second control electrode 124b connects to the first output electrode 175a. The second input electrode 173b connects to the driving voltage line 172. The second output electrode 175b connects to the pixel electrode 191. A channel of the driving TFT Qd is formed in the second semiconductor 154b positioned between the second input electrode 173b and the second output electrode 175b.

The pixel electrode 191, the organic light emitting member 370, and the common electrode 270 form the organic light emitting diode LD. The pixel electrode 191 is an anode and the common electrode 270 is a cathode. Or on the contrary, the pixel electrode 191 is a cathode and the common electrode 270 is an anode.

The storage electrode 127 and the driving voltage line 172 overlapping each other may form the storage capacitor Cst.

The organic light emitting diode display emits light upwards or downwards from the substrate 110 to display an image.

The opaque pixel electrode 191 and the transparent common electrode 270 are applied to a top emission type of organic light emitting diode display which displays an image in an upper direction of the substrate 110, while the transparent pixel electrode 191 and the opaque common electrode 270 are applied to a bottom emission type of organic light emitting diode display which displays an image in a lower direction of the substrate 110.

Further, the control electrodes 124a, 124b, and 124c may be formed on the semiconductors 154a and 154b. The gate insulating layer 140 is positioned between the semiconductors 154a and 154b and the control electrodes 124a, 124b, and 124c in this instance.

In this case, the data conductors 171, 172, 173b, and 175b are positioned on the gate insulating layer 140. The data conductors 171, 172, 173b, and 175b may be connected to the semiconductors 154a and 154b through a contact hole (not shown) formed in the gate insulating layer.

Alternatively, the data conductors 171, 172, 173b, and 175b may be positioned below the semiconductors 154a and 154b to electrically contact the semiconductors 154a and 154b thereon.

The display device according to the exemplary embodiment of the disclosed technology can prevent a parasitic storage capacitance from being generated between the first and third control electrodes 124a and 124c and the source electrode (or the input electrode) or the drain electrode (or the output electrode) as the first and third control electrodes 124a and 124c do not overlap the source electrode (or the input electrode) or the drain electrode (or the output electrode).

Accordingly, a signal delay induced by the parasitic storage capacitance may be prevented.

Further, since the third control electrode is made of the same material as the data conductors, a double gate structure may be provided through a simple process without using an additional mask.

A manufacturing process according to the exemplary embodiment of the disclosed technology will be described hereinafter with reference to FIGS. 6 to 8 together with FIGS. 3 to 5.

Figure 6:
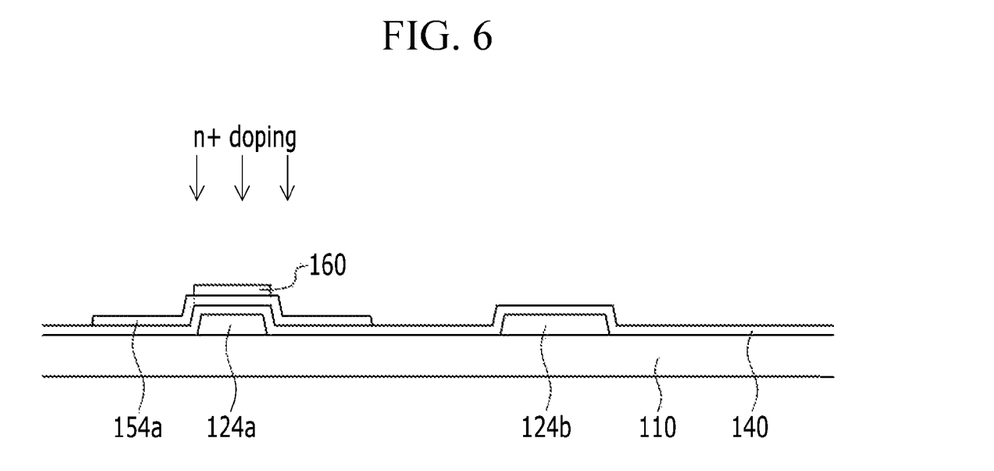
FIGS. 6 to 8 are cross-sectional views of FIG. 3 taken along the line IV-IV according to a manufacturing method according to some exemplary embodiments of the disclosed technology.
Figure 7:
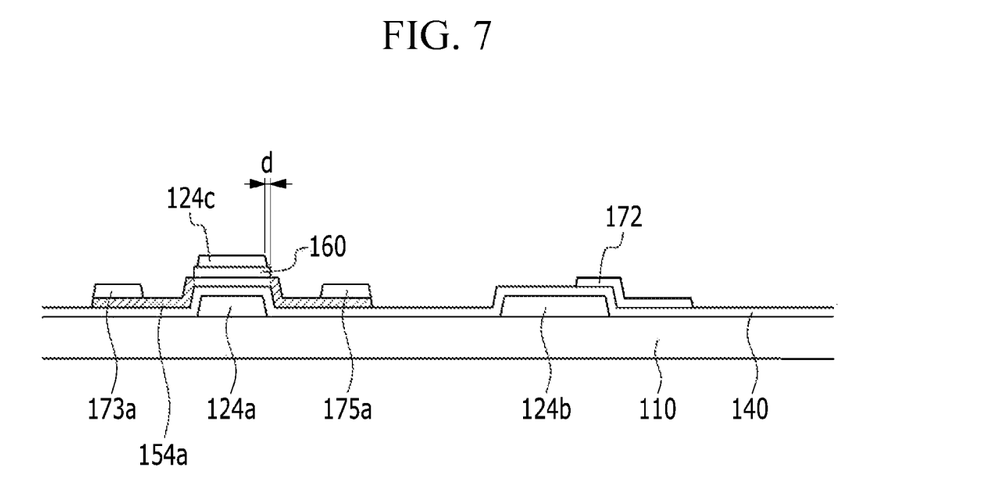
Figure 8:
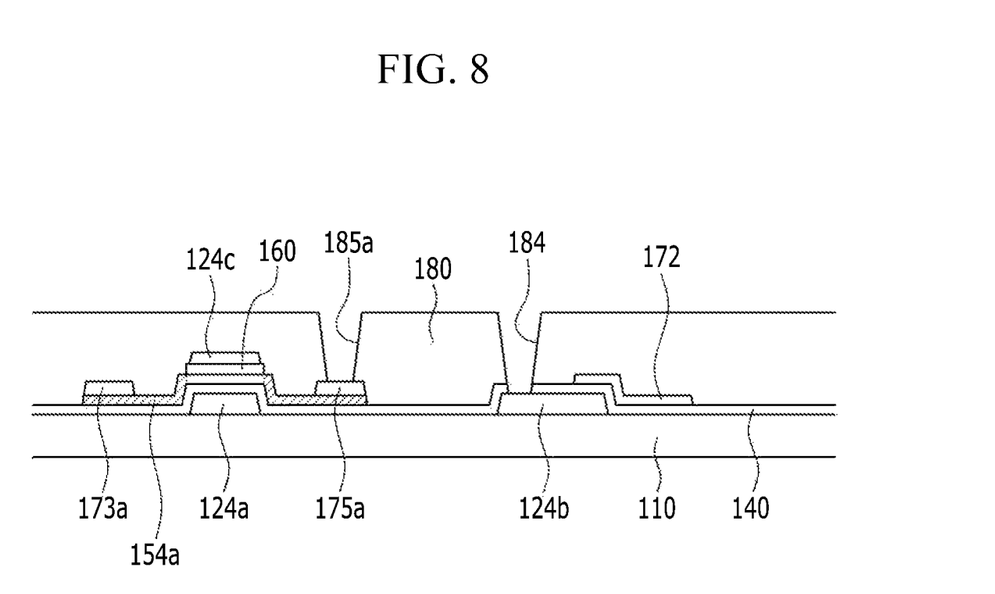

FIGS. 6 to 8 are cross-sectional views of FIG. 3 taken along the line IV-IV, and a detailed description of the conventional manufacturing process will be omitted.

First, referring to FIG. 6, a plurality of gate lines 121 including a first control electrode 124a and a plurality of gate conductors including a plurality of second control electrodes 124b are formed on an insulating substrate 110 made of transparent glass or plastic.

Next, a gate insulating layer 140 is formed on the gate conductors 121 and 124b made of a silicon nitride ($SiN_x$) or a silicon oxide ($SiO_x$)

A semiconductor 154a made of hydrogenated amorphous silicon (referred to as a-Si) and the like is formed on an upper part of the gate insulating layer 140 to be formed in parallel with the gate line 121 while overlapping the control electrode 124.

In this instance, an etch stopper 160 is formed on a protruded upper portion of the semiconductor 154a. The semiconductor 154a is doped with an n+ dopant by using the etch stopper 160 as a mask.

When doping is performed as described above, the semiconductor doped all over with the n+ dopant (the shaded region) except for a region where the etch stopper 160 is formed is formed.

The semiconductor doped with the n+ dopant may have superior conductivity as it acts like a conductor.

Next, as shown in FIG. 7, a plurality of data conductors, including a plurality of data lines 171, a plurality of driving voltage lines 172, and a plurality of first and second output electrodes 175a and 175b, are formed on the semiconductor 154a.

In this instance, the third control electrode 124c positioned on the etch stopper 160 is simultaneously formed by using the mask forming the data conductors.

The etch stopper 160 has a similar shape as the third control electrode 124c to be described later on a plane, and the third control electrode 124c is formed to have a smaller width than the etch stopper 160.

In one exemplary implementation, a distance between one end of the third control electrode 124c and one end of the etch stopper 160 is about 0.1 to 2 μm.

In this instance, the third control electrode 124c may be connected to the first control electrode 124a and applied with the same voltage, but it is not limited thereto, and it may be respectively applied with an independent voltage source.

Next, a passivation layer 180 having a contact hole 185a is formed on the first input electrode 173a, the first output electrode 175a, and the third control electrode 124c as shown in FIG. 8.

As shown in FIGS. 3 to 5, the drain electrode 175a and the pixel electrodes 191 are connected to each other through the contact hole 185a of the passivation layer 180.

Next, a partition wall 361 including an opening 365 is formed on the passivation layer 180 and the pixel electrode 191. An organic light emitting member 370 is formed in the opening 365.

Next, a common electrode 270 is formed on the organic light emitting member 370, thereby forming a display device illustrated in FIGS. 3 to 5.

According to the manufacturing process of the exemplary embodiment of the disclosed technology, since an additional mask for embodying a structure having a dual gate electrode is not required, a display device having excellent performance can be manufactured with low processing complexity and a low cost.

A manufacturing process according to another exemplary embodiment of the disclosed technology will be described hereinafter with reference to FIGS. 9 to 11.

Figure 9:
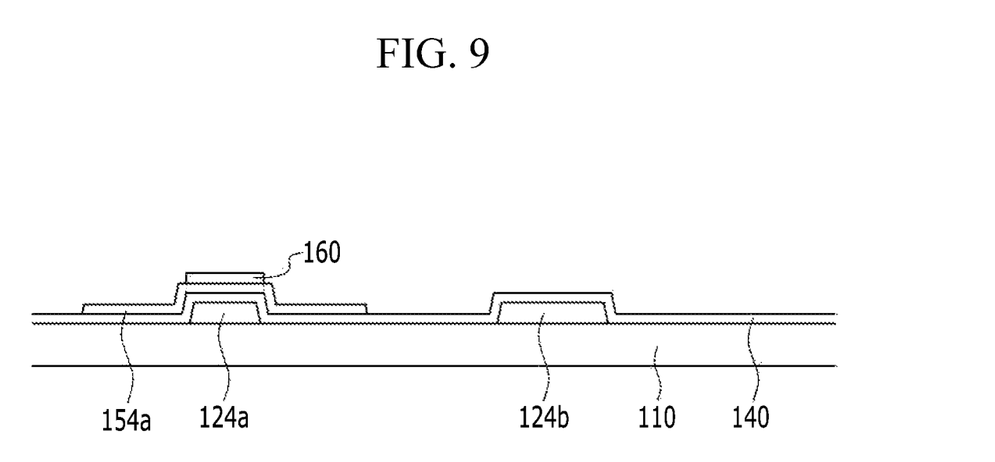
FIGS. 9 to 11 are cross-sectional views of FIG. 3 taken along the line IV-IV according to a manufacturing method according to another exemplary embodiment of the disclosed technology.
Figure 10:
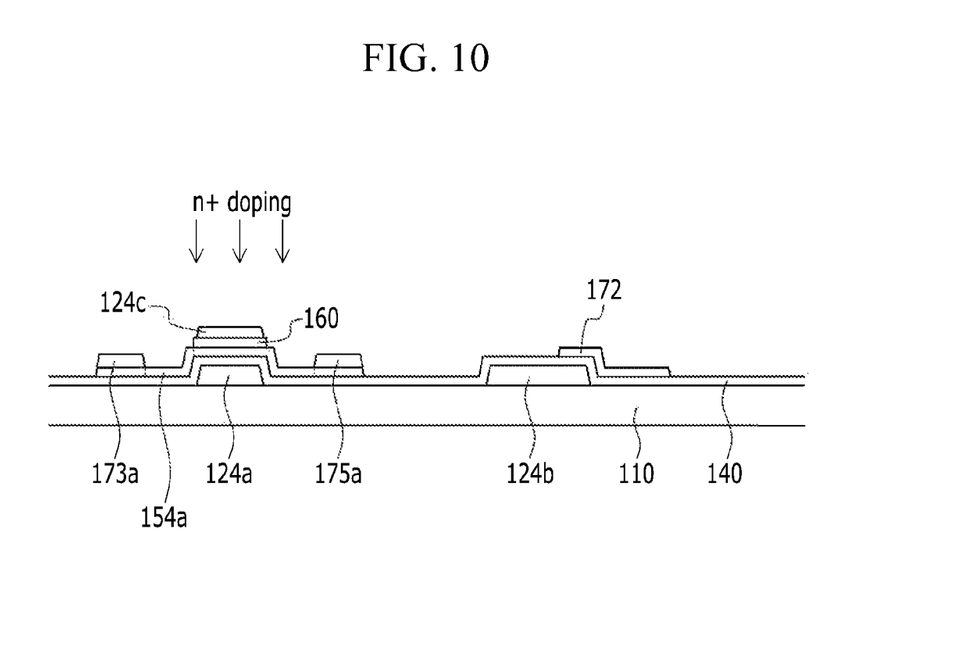
Figure 11:
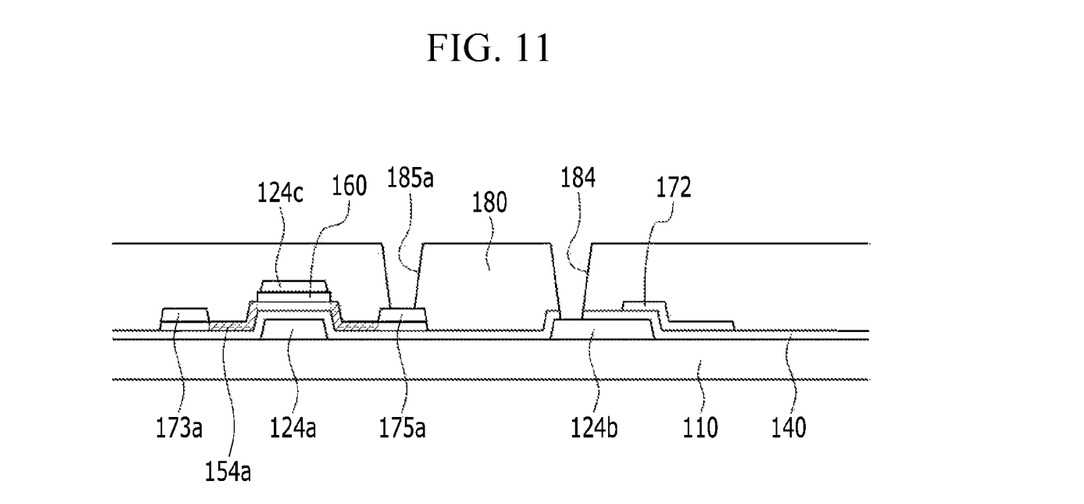

FIGS. 9 to 11 are cross-sectional views of FIG. 3 taken along the line IV-IV.

Referring to FIG. 9, as described in the previous exemplary embodiment of the disclosed technology, an etch stopper 160 positioned on the semiconductor 154a is formed.

However, unlike the processes shown in FIG. 6, a subsequent n+ doping process is omitted.

Once the etch stopper 160 is formed, as shown in FIG. 10, a plurality of data conductors including a plurality of data lines 171, a plurality of driving voltage lines 172. A plurality of first and second output electrodes 175a and 175b are formed.

In this instance, a third control electrode 124c positioned on the etch stopper 160 is also simultaneously formed by using a mask forming the data conductors.

The third electrode 124c has a similar planar shape as the etch stopper 160 on a plane. The third control electrode 124c is formed to have a smaller width than the etch stopper 160.

After forming the data conductors 171 and the third control electrode 124c as described above, n+ doping is performed over the semiconductor 154a, as shown in FIG. 11, by using the data conductors 171 and the third control electrode 124c as the mask to dope the exposed portions of the semiconductor 154a which are formed between the source and drain electrodes and the third control electrode 124c, with the n+ dopant.

This is because regions other than the exposed portions are covered with the input electrode, the output electrode, or the third control electrode.

The doped region has superior conductivity as it acts like a conductor.

Next, a passivation layer 180 is formed on the data conductor 171 and the third control electrode 124c. A contact hole 185a is formed to electrically connect the drain electrode to the pixel electrode.

Next, referring to FIGS. 12 to 14, a manufacturing process according to the current exemplary embodiment of the disclosed technology will be described.

Figure 12:
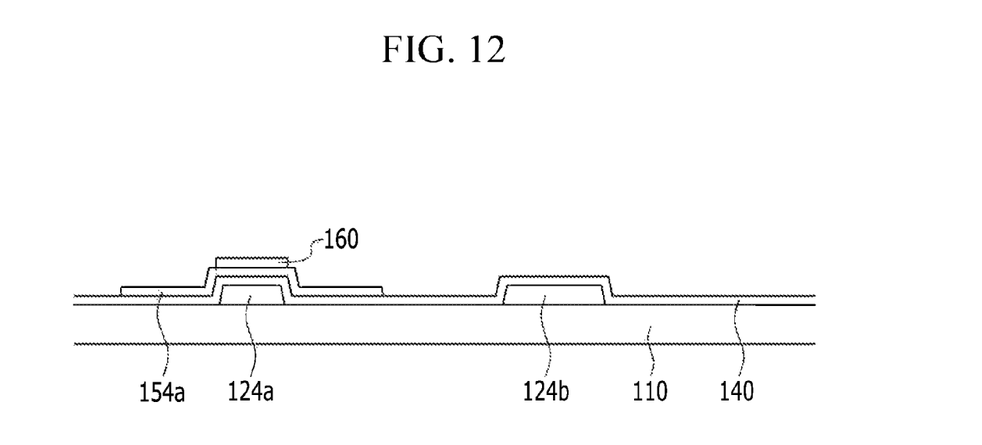
FIGS. 12 to 14 are cross-sectional views of FIG. 3 taken along the line IV-IV according to a manufacturing method according to the other exemplary embodiment of the disclosed technology.
Figure 13:
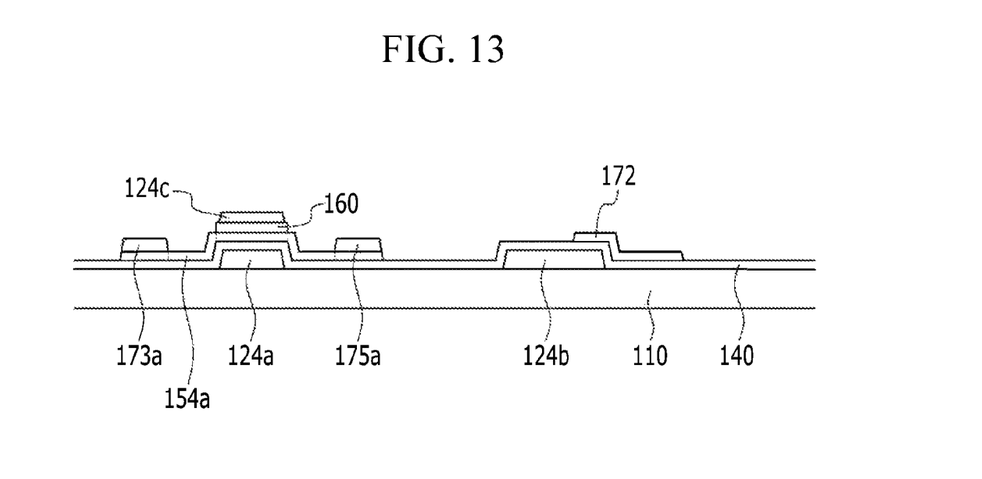
Figure 14:
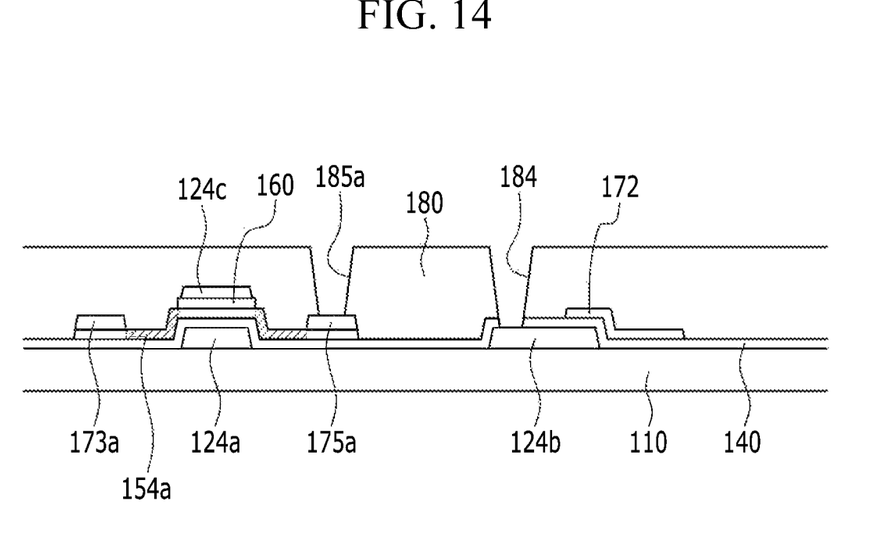

FIGS. 12 to 14 are cross-sectional views of FIG. 3 taken along the line IV-IV.

First, referring to FIG. 12, an etch stopper 160 is formed on the semiconductor 154a.

However, like the processes shown in FIG. 9, an n+ doping process of the semiconductor 154a is omitted.

Next, as shown in FIG. 13, a plurality of data conductors including a plurality of data lines 171, a plurality of driving voltage lines 172. A plurality of first and second output electrodes 175a and 175b are formed on the semiconductor 154a.

In this instance, a third control electrode 124c positioned on the etch stopper 160 is also simultaneously formed by using a mask forming the data conductors.

The third control electrode 124c is formed to have a corresponding shape to the etch stopper 160 on a plane. Particularly, the third control electrode 124c is formed to have a smaller width than the etch stopper 160.

Next, as shown in FIG. 14, a passivation layer 180 is formed on the first input electrode 173a, the first output electrode 175a, and the third control electrode 124c without an additional n+ doping process.

The passivation layer 180 may include an oxide containing fluorine such as fluorine-doped silicon dioxide (SiOF).

As the passivation layer 180 including an oxide containing fluorine is heat-treated, the semiconductor region 154a directly contacting the passivation layer 180 may have the same physical properties as the n+ doped region described above.

That is, the shaded region may form the semiconductor 154 doped with the n+ dopant without an additional n+ doping process.

The n+ doped region acts like a conductor to form the semiconductor 154a having superior conductivity.

In summary, in the manufacturing method of the display device according to various exemplary embodiments of the disclosed technology, inventive manufacturing processes such as forming the data conductors and the third control electrode 124c through a mask and forming the semiconductor region doped with the n+ dopant have been described.

For purposes of summarizing the disclosed technology, certain aspects, advantages and novel features of the disclosed technology have been described herein. It is to be understood that not necessarily all such advantages is achieved in accordance with any particular embodiment of the disclosed technology. Thus, the disclosed technology is embodied or carried out in a manner that achieves or optimizes one advantage or group of advantages as taught herein without necessarily achieving other advantages as is taught or suggested herein.

Various modifications of the above described embodiments will be readily apparent, and the generic principles defined herein is applied to other embodiments without departing from the spirit or scope of the disclosed technology. Thus, the disclosed technology is not intended to be limited to the embodiments shown herein but is to be accorded the widest scope consistent with the principles and novel features disclosed herein.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the disclosed technology have been described with reference to the figures, it will be understood by those of ordinary skill in the art that various changes in form and details may be made therein without departing from the spirit and scope of the disclosed technology as defined by the following claims.

What is claimed is:

1. A display device comprising a plurality of thin film transistor (TFTs), each TFT comprising:
   a first control electrode formed on a substrate;
   a semiconductor layer formed on the first control electrode;
   an etch stop layer formed on the semiconductor layer;
   a first input electrode and a first output electrode formed on the semiconductor layer, wherein the etch stop layer does not contact the first input and first output electrodes;
   a third control electrode formed on the etch stop layer;
   a passivation layer formed on the first input electrode, the first output electrode and the third control electrode; and
   a pixel electrode formed on the passivation layer and connected to the first output electrode.

2. The display device of claim 1, wherein the first input electrode, the first output electrode and the third control electrode are formed of the same material.

3. The display device of claim 1, wherein the third control electrode has a width less than that of the etch stop layer.

4. The display device of claim 3, wherein the distance between one end of the third control electrode and one end of the etch stop layer is between about 0.1 μm and about 2 μm.

5. The display device of claim 1, wherein the semiconductor layer is formed of an oxide semiconductor.

6. The display device of claim 5, wherein the semiconductor layer is doped with an n+ dopant.

7. The display device of claim 1, wherein the first and third control electrodes are supplied with the same voltage.

8. The display device of claim 1, wherein the etch stop layer does not overlap the first input electrode and the first output electrode.

9. The display device of claim 1, wherein the first input electrode and the first output electrode are formed below the etch stop layer.

10. The display device of claim 1, wherein the first control electrode is thicker than the third control electrode.

11. A display device comprising a plurality of thin film transistor (TFTs), each TFT comprising:
    a first control electrode formed on a substrate;
    a semiconductor layer formed on the first control electrode;
    an etch stop layer formed on the semiconductor layer;
    a first input electrode and a first output electrode formed on the semiconductor layer;
    a third control electrode formed on the etch stop layer;
    a passivation layer formed on the first input electrode, the first output electrode and the third control electrode; and
    a pixel electrode formed on the passivation layer and connected to the first output electrode, wherein the passivation layer is formed of silicon, and wherein the semiconductor layer contacts the passivation layer and includes an n+ doped region.

12. A manufacturing method of a display device, comprising:
    forming a gate conductor including a first control electrode on a substrate;
    forming a gate insulating layer on the gate conductor;
    forming a semiconductor layer on the gate insulating layer;
    forming an etch stop layer on the semiconductor layer;
    forming a first input electrode, a first output electrode and a third control electrode on the etch stop layer and the semiconductor layer, wherein the etch stop layer does not contact the first input and first output electrodes;
    forming a passivation layer on the first input electrode, the first output electrode, and the third control electrode; and
    forming a pixel electrode connected to the first output electrode on the passivation layer.

13. The method of claim 12, wherein the first input electrode, the first output electrode and the third control electrode are formed of the same material and are simultaneously formed.

14. The method of claim 12, wherein the third control electrode has a width less than that of the etch stop layer.

15. The method of claim 14, wherein a distance between one end of the third control electrode and one end of the etch stop layer is formed to be about 0.1 to about 2 μm.

16. The method of claim 12, wherein the semiconductor layer is formed of an oxide semiconductor, and wherein the semiconductor layer is doped with an n+ dopant.

17. The method of claim 16, wherein the n+ doping of the semiconductor layer is performed after forming the etch stop layer.

18. The method of claim 16, wherein the n+ doping of the semiconductor layer is performed after forming the first input electrode, the first output electrode, and the third control electrode.

19. The method of claim 14, wherein the first and third control electrodes are supplied with the same voltage.

20. The method of claim 12, wherein the etch stop layer is formed above the first input electrode and the first output electrode.

21. A manufacturing method of a display device, comprising:
    forming a gate conductor including a first control electrode on a substrate;
    forming a gate insulating layer on the gate conductor;

forming a semiconductor layer on the gate insulating layer;
forming an etch stop layer on the semiconductor layer;
forming a first input electrode, a first output electrode and a third control electrode on the etch stop layer and the semiconductor layer;
forming a passivation layer on the first input electrode, the first output electrode, and the third control electrode; and
forming a pixel electrode connected to the first output electrode on the passivation layer, wherein the passivation layer is formed of silicon, and wherein the position of the semiconductor layer contacting the passivation layer forms an n+ doped region as the passivation layer is heat-treated.

* * * * *